though it is, nonetheless, excellent. The cabin is splendidly appointed, and the service is of the highest quality.

(12) United States Patent
Etlinger

(10) Patent No.: US 9,521,772 B2
(45) Date of Patent: Dec. 13, 2016

(54) HOUSING FOR RECEIVING ELECTROTECHNICAL COMPONENTS

(71) Applicant: KEBA AG, Linz (AT)

(72) Inventor: Gerhard Etlinger, Karlsbach (AT)

(73) Assignee: KEBA AG, Linz (AT)

( * ) Notice: Subject to any disclaimer, the term of this patent is extended or adjusted under 35 U.S.C. 154(b) by 0 days.

(21) Appl. No.: 14/374,589

(22) PCT Filed: Jan. 25, 2013

(86) PCT No.: PCT/AT2013/050024
§ 371 (c)(1),
(2) Date: Oct. 10, 2014

(87) PCT Pub. No.: WO2013/110112
PCT Pub. Date: Aug. 1, 2013

(65) Prior Publication Data
US 2015/0028731 A1    Jan. 29, 2015

(30) Foreign Application Priority Data

Jan. 26, 2012  (DE) .................... 20 2012 100 272 U

(51) Int. Cl.
*A47B 81/00*   (2006.01)
*A47B 97/00*   (2006.01)
(Continued)

(52) U.S. Cl.
CPC ............ *H05K 5/068* (2013.01); *H05K 5/0017* (2013.01); *H05K 5/03* (2013.01); *H05K 5/061* (2013.01);
(Continued)

(58) Field of Classification Search
CPC .......... H05K 5/068; H05K 5/061; H05K 5/03; H05K 5/069; H05K 5/06; H05K 8/062; H05K 5/063; B65D 53/06; F16J 15/02; F16J 15/021; F16J 15/025; F16J 15/06; F16J 15/061; F16J 15/062; F16J 15/067; F16J 15/104; F16J 15/121; F16J 15/125
(Continued)

(56) References Cited

U.S. PATENT DOCUMENTS 4,081,083 A * 3/1978 Glauser .................... B61G 5/08
                                                              213/76
4,298,204 A * 11/1981 Jinkins ................... F16J 15/062
                                                              220/378
(Continued)

FOREIGN PATENT DOCUMENTS

AT   DE 102006006386 A1 *  8/2007  .......... H04M 1/0249
DE   10 2006 006 386 A1    8/2007
(Continued)

OTHER PUBLICATIONS

International Search Report of PCT/AT2013/050024, mailed Jul. 4, 2013.

*Primary Examiner* — Daniel J Troy
*Assistant Examiner* — Andres Gallego
(74) *Attorney, Agent, or Firm* — Collard & Roe, P.C.

(57) ABSTRACT

A housing for receiving electrotechnical components includes a first and a second housing shell having, respectively, a first housing web that forms a sealing face and a second housing web that forms a further sealing face. The first and second housing webs are part of an inner wall of a double-walled casing portion of the housing. Two resilient sealing elements for sealing a transition portion are formed between the housing shells. In the assembled state, the first and second housing webs are aligned one above the other and substantially flush and the longitudinal edges thereof facing each other are arranged at a distance apart. A carrier element forms a bridging element between the housing webs
(Continued)

and presses the sealing elements in the transverse direction or in the assembly direction against the sealing faces.

13 Claims, 5 Drawing Sheets

(51) Int. Cl.
  *H05K 5/06* (2006.01)
  *H05K 5/00* (2006.01)
  *H05K 5/03* (2006.01)
(52) U.S. Cl.
  CPC .............. *H05K 5/069* (2013.01); *H05K 5/062* (2013.01); *H05K 5/063* (2013.01)
(58) Field of Classification Search
  USPC .......................................................... 174/50
  See application file for complete search history.

(56) References Cited

U.S. PATENT DOCUMENTS

| | | | | |
|---|---|---|---|---|
| 4,331,338 A * | 5/1982 | Caldwell | ................ | F16J 15/021 277/606 |
| 5,687,975 A * | 11/1997 | Inciong | ................... | F02F 7/006 277/591 |
| 5,703,325 A * | 12/1997 | Yamaguchi | ............ | H02G 3/088 174/50 |
| 6,455,768 B2 * | 9/2002 | Negishi | .................. | H05K 5/061 174/135 |
| 6,561,522 B1 * | 5/2003 | Radelet | .................. | F16J 15/021 277/314 |
| 6,753,473 B2 * | 6/2004 | Barlian | .................. | H05K 5/063 174/50 |
| 7,403,837 B2 * | 7/2008 | Graiger | ................ | G05B 19/409 361/71 |
| 7,762,415 B2 * | 7/2010 | Matsui | ................... | H02G 3/088 174/58 |
| 7,828,302 B2 | 11/2010 | Hurlbert et al. | | |
| 7,967,298 B2 | 6/2011 | Hurlbert et al. | | |
| 8,053,668 B2 * | 11/2011 | Lai | ...................... | H05K 9/0009 174/17 R |
| 8,080,732 B2 * | 12/2011 | Wang | ...................... | H05K 5/02 174/17 R |
| 8,796,548 B2 * | 8/2014 | Rost | ........................ | H05K 5/061 174/50 |
| 2003/0000720 A1 * | 1/2003 | Sato | ....................... | H02G 3/088 174/50 |
| 2013/0161051 A1 * | 6/2013 | Imamura | ........... | G07C 9/00944 174/50 |
| 2013/0292838 A1 * | 11/2013 | Ganesan | ............... | H01L 23/562 257/773 |
| 2014/0091536 A1 * | 4/2014 | Bae | ......................... | H05K 5/06 277/641 |

FOREIGN PATENT DOCUMENTS

| | | |
|---|---|---|
| GB | 2 064 879 A | 6/1981 |
| JP | 2011-190892 A | 9/2011 |
| WO | 03/001393 A2 | 1/2003 |
| WO | 2009/023824 A2 | 2/2009 |

* cited by examiner

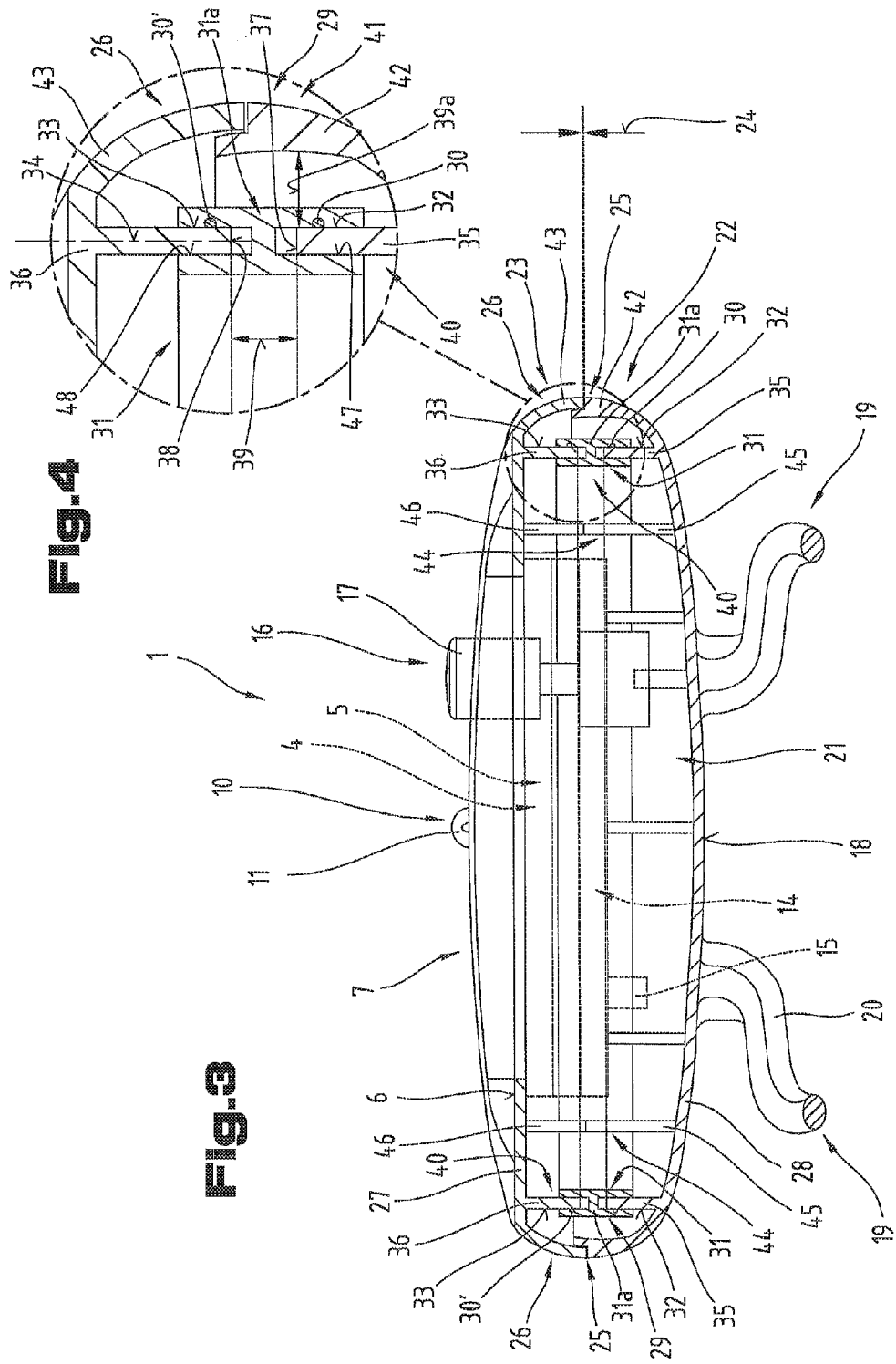

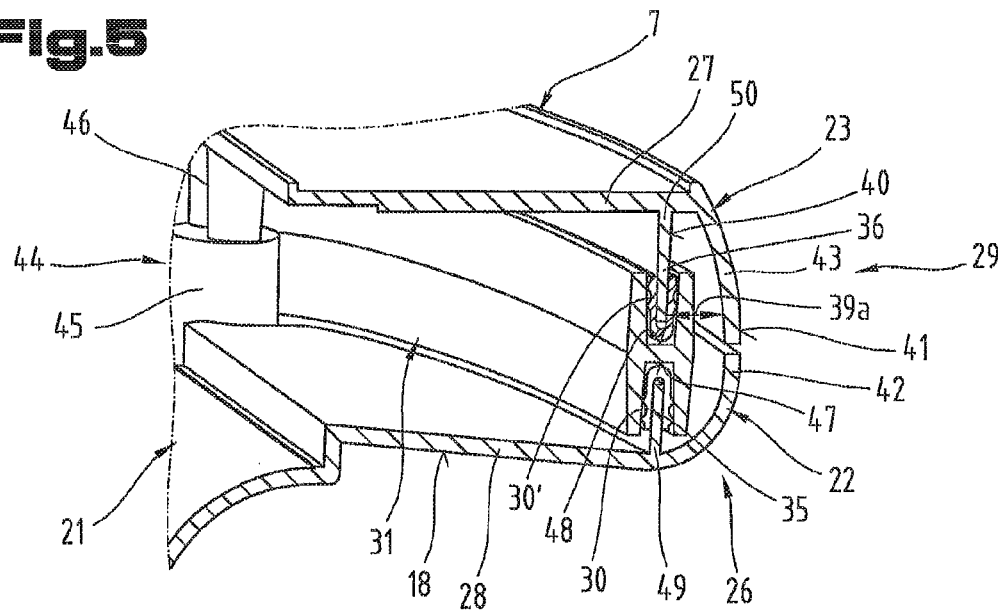
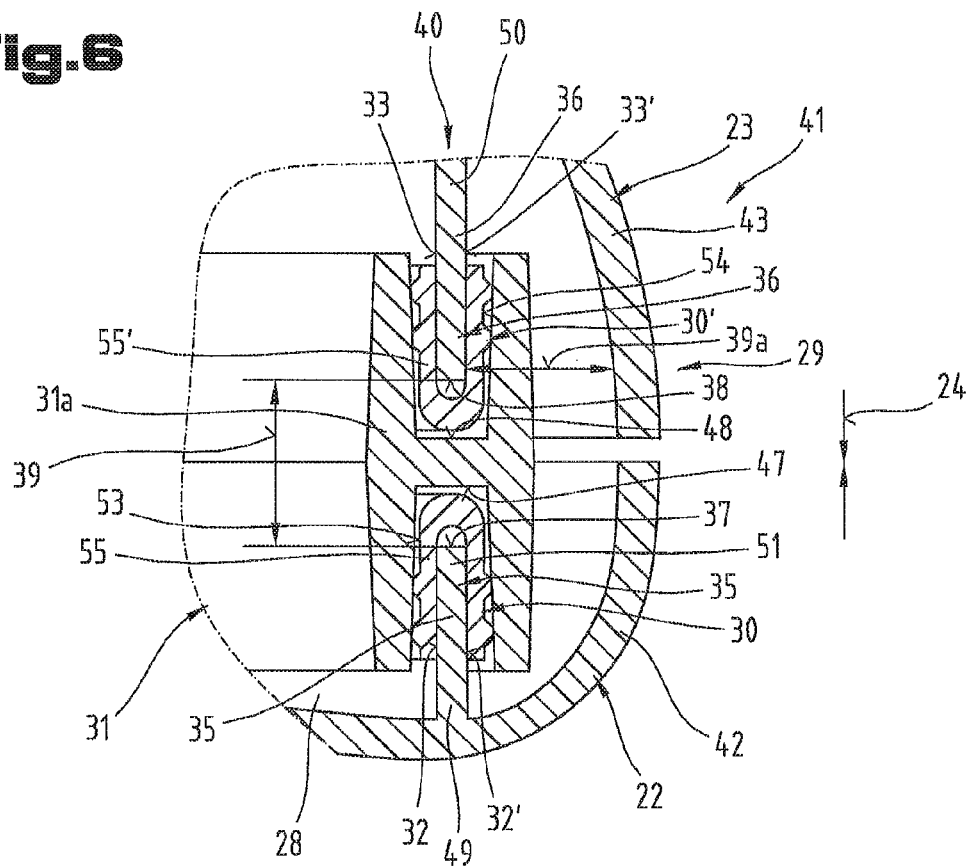

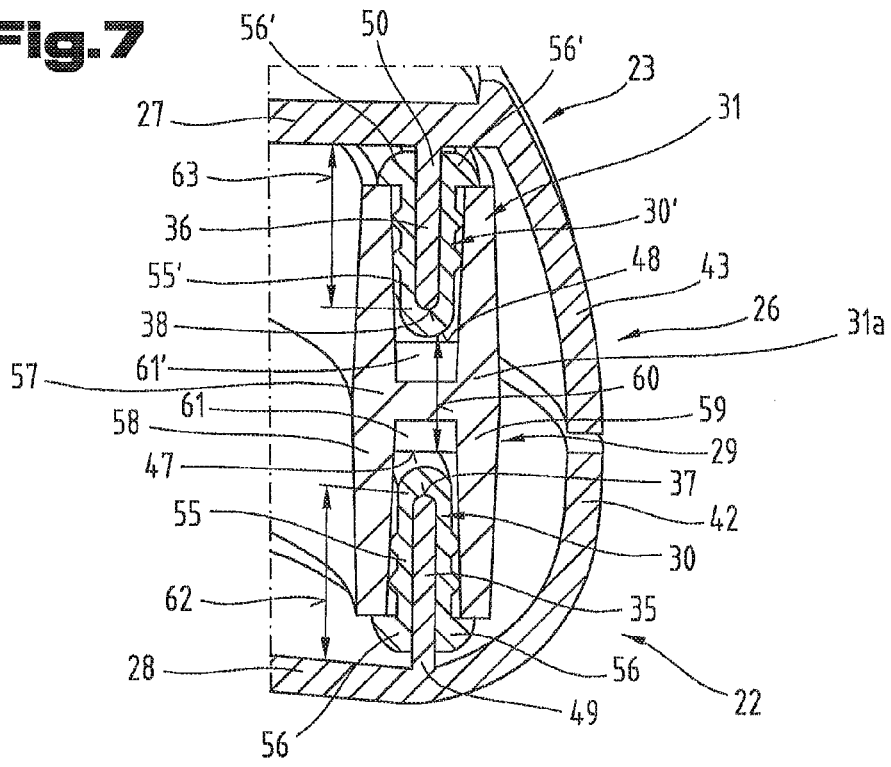
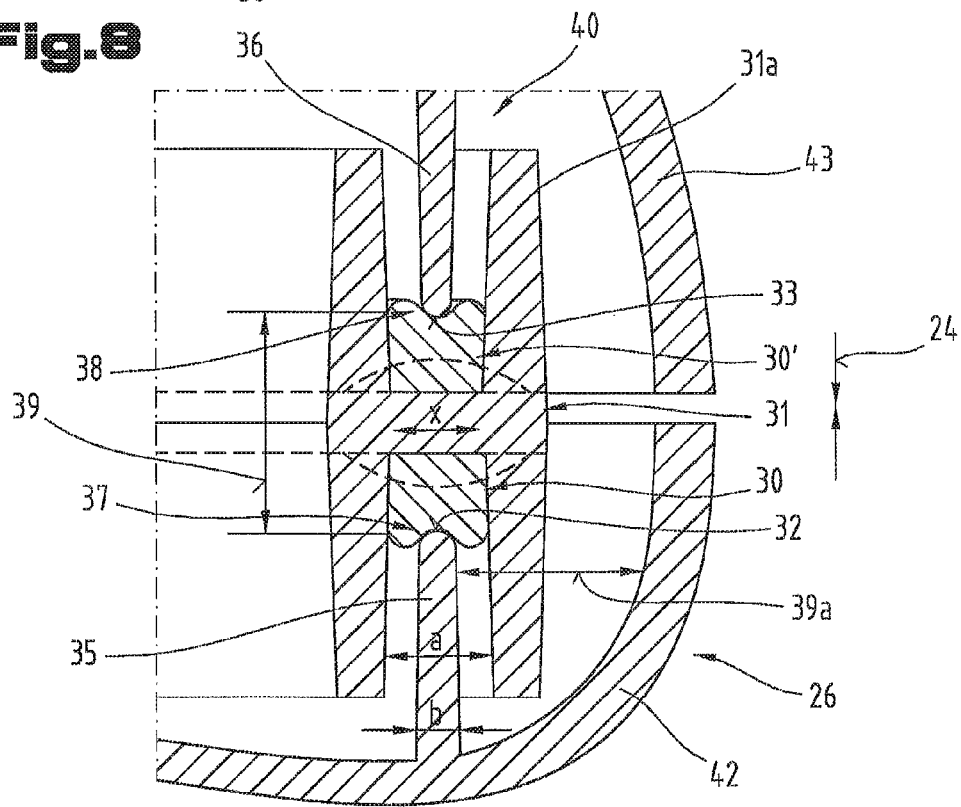

HOUSING FOR RECEIVING ELECTROTECHNICAL COMPONENTS

CROSS REFERENCE TO RELATED APPLICATIONS

This application is the National Stage of PCT/AT2013/050024 filed on Jan. 25, 2013 which claims priority under 35 U.S.C. §119 of German Application No. 20 2012 100 272.8 filed on Jan. 26, 2012, the disclosure of which is incorporated by reference. The international application under PCT article 21(2) was not published in English.

BACKGROUND OF THE INVENTION

1. Field of the Invention

The invention relates to a housing for receiving electrotechnical components.

2. Description of the Related Art

A generic housing is described in WO 03/001393 A2, which is in the name of the Applicant. Here in the transitional area between the housing shells forming the housing and joined together in a form-fitting manner a sealing element is arranged for sealing the inner chamber from the external environment. According to one embodiment variant of said housing a double-walled casing portion has been proposed in order to improve its sensitivity to impact and breaking strength. The band or ring-like sealing element is clamped between the inner wall and the outer wall of the double-walled casing portion, so that it exerts a sealing force perpendicular to the sealing faces, in particular to the wall webs, which sealing force needs to be absorbed or picked up by the wall webs. The sealing effect achievable by this embodiment and the fitting of the sealing element are only satisfactory to a limited extent in this case.

GB 2 064 879 A describes a housing of a display and/or control unit which is designed for marine applications, in particular for use on yachts. The housing of said display and/or control unit is formed by three external components or three elements which can be accessed from the outside. In particular, a shell-like front element, a shell-like rear wall element and a board-like intermediate element are arranged on top of one another in a sandwich-like structure so that as a whole they form the outer borders of the display and/or control unit. The board-like intermediate element is provided for mounting a printed board for the electronic components and has in its circumferential section, which defines a central portion of the casing surface of the housing, an essentially I-shaped cross-sectional contour. In two circumferentially running grooves of said board-like intermediate element a cord-like sealing element is inserted. The outermost delimiting web of said board-like intermediate part for mounting the electronic components thus forms an outer delimiting face in the casing surface of the housing of the display and/or control unit. The robustness and sealing effect achievable by this configuration is not entirely satisfactory for industrial applications.

JP 2011-190892 A discloses a sealing element which is arranged between a first and a further housing part and seals the transitional gap between the two housing elements. The sealing element comprises a carrier element with an approximately H-shaped cross section. Said sealing element is made of plastic and mounts a pair of sealing elements made from a rubber-like material. Said sealing elements made of rubber-like material are mounted integrally in the two mounting depressions of the H-like carrier element. From said sealing elements sealing lips project respectively over the groove-like mounting recesses and lip-like rubber material projects over the bordering edges of the carrier element made of hard plastic. In this way a small sealing element is created which makes it unnecessary to form grooves in the housing parts and which is intended to achieve the simple handling of the sealing element as well as a stable sealing effect. The sealing lips projecting from the carrier element enable an effective seal between grooveless plate or housing elements placed flat on top of one another. A seal between shell-like housing parts, the wall webs of which face one another, cannot be achieved satisfactorily by the described sealing element.

DE 10 2006 006 386 A1 describes a further generic housing which is also in the name of the applicant. In this case a housing is proposed for electronic devices, in particular for mobile hand-controlled devices of an industrial control. Said housing comprises a half-shell lower housing part and a half-shell upper housing part, the edge-side wall sections of which in the assembled state form the casing surface of the housing. A continuously extending or partly interrupted inner wall runs spaced apart essentially constantly from an outer wall forming the casing surface of the housing. Furthermore, a sealing element is arranged lying at least partly between the outer wall and the inner wall to avoid the penetration of the solid and liquid materials. In this case in a portion of the sealing element facing the inner side of the outer wall at least two lip-like sealing extensions are formed, which each bear on the inner faces of the lower housing part and the upper housing part and exert elastic pretensioning on said inner faces, from the inner wall in outwards direction. In this way the robustness of the housing is improved, the assembly of the housing parts with the sealing element lying between the inner and outer wall is relatively complicated however. Furthermore, the sealing elements required are comparatively expensive and complex to shape.

SUMMARY OF THE INVENTION

The underlying objective of the present invention is to create a housing for receiving electro-technical components which provides better sealing and robustness and is as easy as possible to handle during manufacture and during installation or assembly.

The objective is achieved by the technical measures according to the invention.

An advantage resulting from the according to the invention is that a housing of this kind has an improved sealing effect from the external environment and enables a relatively simple assembly or simple installation and attachment of the at least one sealing element. Furthermore, the bridging element between the housing webs or the corresponding carrier element for the at least one sealing element provides improved robustness of the housing, since transverse forces exerted by the sealing element to the wall-like housing webs are avoided. In particular, in this way no transverse forces and no bending forces are exerted on the housing webs on which the at least one sealing element bears, which forces would cause the one-sided pretensioning or loading and deformation of the wall-like housing webs. Such permanent pretensioning transverse to the wall surface of the housing webs has a negative effect mainly in the case of impact loads. In an advantageous manner the pressing or sealing force is transmitted by means of the bridging element to the sealing faces on the first and the further housing web, whereby no lateral displacement forces act on the first and further housing web. As well as the increased robustness and sealing effect there are also advantages in terms of injection molding, as by using the carrier or bridging element the effective heights of the first and further housing webs can be reduced. By avoiding transverse forces on the wall-like housing webs the latter can also be configured to be comparatively thin-walled or to have only a small number of reinforcing ribs, which reduces the problem of developing sink marks on the outside of the housing during the solidification of the plastic mass.

Furthermore, by means of the spacing between the inner wall and the outer wall a type of buffer zone is created which averts impact loads or elastic deformations up to a specific strength, before the impact has a direct effect on the inner wall. Furthermore, in this way potential, additional dirty edges are avoided, since the bridging or carrier element for the at least one sealing element is mounted on the inside of the housing. In addition, it is ensured that the carrier element elastically deforms the at least one elastomer sealing element when adopting its installation position and thus ensures a reliable and continuous sealing effect. Furthermore, in this way also dimensional tolerances can be compensated for in a simple manner. An additionally improved sealing effect is achieved in that the free end section of the housing webs is cupped so that on the opposite wall faces of the housing webs sealing faces and sealing effects occur. In particular, in this way in a simple manner a multiple seal is achieved and thus the reliability of the sealing effect is increased further.

The sealing effect is thus improved further as a multiple sealing effect is achieved, which maintains the sealing effect at all times even in the case of impact-related deformations of the housing webs. Furthermore, in this way transverse loads on the housing webs are avoided, as the sealing forces are applied by the carrier element surrounding or enclosing the end portions of the housing webs.

The measures according to an embodiment are also advantageous, as by allocating the bridging element and the carrier element for the sealing elements to the inner wall, the intended positioning of the at least one sealing element is reliably maintained. In particular, in this way the sealing element is not accessible from the outside so that any displacements thereof are prevented.

Furthermore, by means of the measures according to another embodiment the sealing elements can be mounted easily and a simple assembly of the housing shells is achieved. In particular, the unwanted displacement of the sealing elements is avoided during the assembly of the housing shells.

It is an advantage with the measures according to another embodiment that the corresponding carrier element provides an adequate pretensioning or sealing effect on the housing webs, without exerting bending or displacement forces on the housing webs. A further advantage is that the sealing elements can be mounted reliably in the corresponding depressions and are prevented from slipping disadvantageously during the assembly. In addition, in this way the robustness of the structure and its sealing properties are influenced positively.

By way of the measures according to another embodiment the assembly time can be reduced and at the same time the robustness and stability of the housing webs can be improved, since the latter are coupled together in a form-fitting manner by the bridging carrier element or are connected to one another mechanically.

By means of the measures according to another embodiment it is ensured that the sealing element is forced with permanent pretensioning against the corresponding sealing faces of the housing webs. The respective sealing forces are thereby exerted by the carrier element per se, without lateral displacement or bending forces being exerted on the housing webs. In particular, by means of a suitable dimensioning of the geometric relationships between the sealing element and carrier element a good or reliable sealing effect and simple assembly is ensured.

An even better sealing effect can be achieved by the measures according to another embodiment. In particular, in this way the free end portion of the housing webs are cupped so that sealing faces or sealing effects occur on opposite wall faces of the housing webs. In particular, in this way a multiple seal is achieved in a simple manner and thereby the reliability of the sealing effect is increased further.

An inexpensive, sufficiently dimensionally precise and suitably flexible or preformed carrier element can be created by the measures according to another embodiment.

By way of the measures according to another embodiment also complex forms or greatly varying external contours of the housing can be reliably traced or adopted by the carrier element without the expensive and precise preforming of the carrier element being necessary.

Alternatively or in combination therewith a configuration according to another embodiment is also advantageous, as by means of the preforming or precontouring of the carrier element even with a relatively rigid carrier element or even with complex or abrupt changes to the housing contour or the housing webs a particularly precisely fitting union with the carrier element is made possible and thereby an improved sealing effect is achieved.

By way of the measures according to another embodiment housings or housing forms can be created which are highly ergonomic, which is of great importance mainly with regard to housings or devices that are to be carried or held by hand by an operator. Despite, ergonomically shaped, intensively contoured forms of the external housing surface or the housing webs the sealing effect can also be ensured more effectively even with impact-related, elastic deformations of the webs. This is important for example in the case of housing contours with a dumbbell or bone-like housing contour or T-shaped housing contours.

In the configuration according to another embodiment the opposite longitudinal edges of the two housing webs are used as sealing faces. By means of their cutting effect, even with a relatively small pressing force, a reliable sealing effect is ensured between the housing webs and the respectively assigned sealing elements.

BRIEF DESCRIPTION OF THE DRAWINGS

For a better understanding of the invention the latter is explained in more detail with reference to the following figures.

In a much simplified, schematic representation:

FIG. 3 shows a schematic cross section of the device according to arrow III-III in FIG. 2;

FIG. 4 shows a detailed view of the casing portion of the housing according to FIG. 3;

FIG. 5 shows a portion of another housing form in the region of the housing casing;

FIG. 6 shows an enlarged view of the embodiment according to FIG. 5;

FIG. 7 shows a further embodiment of a casing portion of a housing in cross section;

FIG. 8 shows another embodiment of the sealing element in the transitional portion between a first and a further housing shell;

DETAILED DESCRIPTION OF THE PREFERRED EMBODIMENTS

Figure 1:
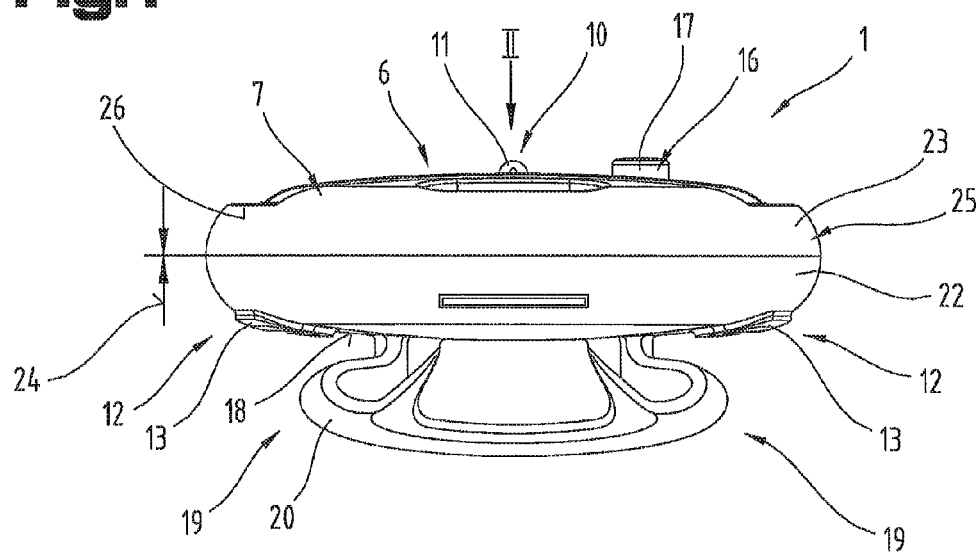
FIG. 1 shows an exemplary embodiment of a portable device which comprises a housing consisting of a first and a further housing shell.
Figure 2:
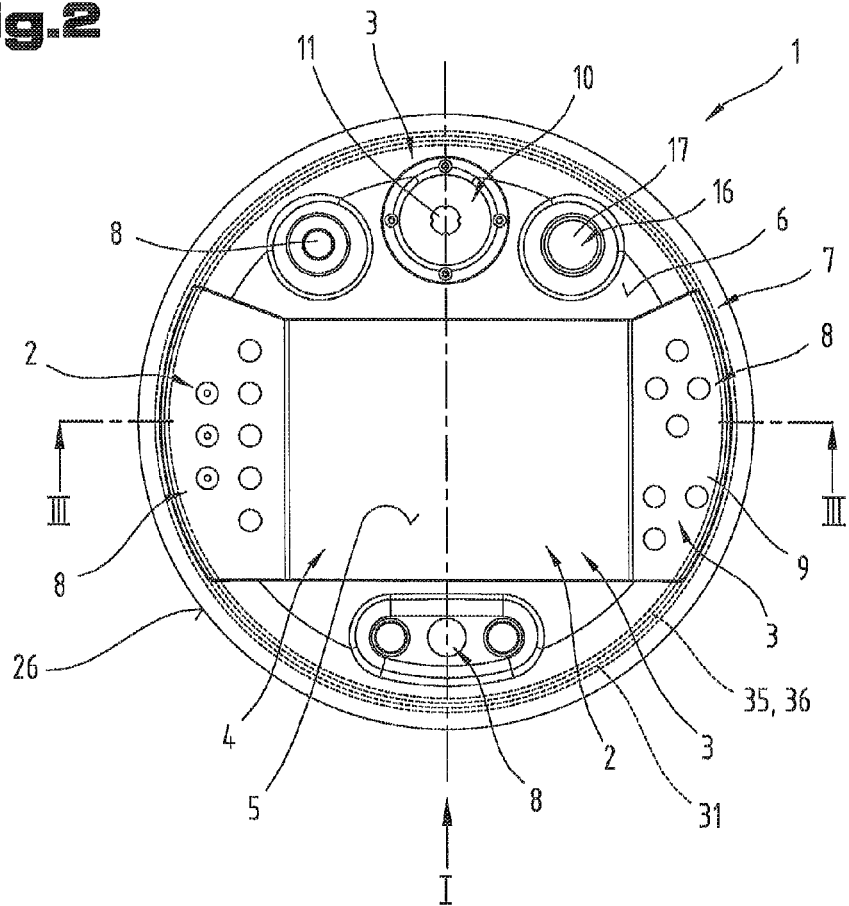
FIG. 2 shows the device according to FIG. 1 in a view from above according to arrow II in FIG. 1.

First of all, it should be noted that in the variously described exemplary embodiments the same parts have been given the same reference numerals and the same component names, whereby the disclosures contained throughout the entire description can be applied to the same parts with the same reference numerals and same component names. Also details relating to position used in the description, such as e.g. top, bottom, side etc. relate to the currently described and represented figure and in case of a change in position should be adjusted to the new position.

FIGS. 1 to 4 illustrate an exemplary embodiment of a portable or mobile device 1. Said device 1 is used at least for operating or influencing the sequences of industrial manipulators or robots, machines, such as e.g. machine tools or special purpose machines, conveyor systems, crane systems or other technical systems, in which technical processes are performed fully automatically, semi-automatically or controlled manually. In addition to operating or influencing the aforementioned machines or process sequences the device 1 can also be used for visualizing process or system data. The device 1 can thus be an operating unit and/or a visualization or viewing device. Alternatively or in combination with at least one the aforementioned purposes the device 1 can also be used for programming the sequences of machines or robots provided with actuators or electric sensors. In a programming mode of this kind for example also the "teaching" of machines or robots can be performed.

The device 1 is to be operated by hand and has a suitable size and weight so that it can be easily carried by a user to different places of use. This means that a device 1 can also be assigned to different, spaced apart machines or robots and the user can see for example movement sequences or the like in an optimal manner as his freedom of movement is not really restricted by the device 1.

The device 1 can comprise at least one output device 2 at least for visualizing the process data of a machine, a robot or a technical process. The output device 2 comprises at least one optical output element and if necessary also acoustic output elements, such as buzzers, loudspeakers or the like. In addition to alternatively to the process data via the optical output device 2 input data or input menus and screen masks can also be displayed. Individual optical output devices 2 can also be formed by optical signal sources, such as e.g. light-emitting diodes.

Furthermore, the device 1 comprises at least one input device 3, by means of which individual operating functions of at least the device 1 can be influenced or selected. Preferably, the input device 3 is also used however for operating a machine or a robot or for emitting control commands to such machines. By means of the input device 3 thus internal sequences of the device 1 and/or an associated machine can be changed and data can be input, retrieved and/or changed.

According to one advantageous configuration the device 1 comprises a combined output and input device 2, 3 in the form of a touch-sensitive screen 4. Said touch-sensitive screen 4 of the device 1 is a so-called touchscreen 5, in which the output and input device 2, 3 are functionally combined or structurally overlayered. The touch-sensitive screen 4 of the device 1 can extend over extensive areas of a surface, in particular an upper side 6 of a housing 7 of the device 1. By means of a touchscreen 5—as already known—graphics, symbols, characters and the like can be output and by activating the touch-sensitive surface with a finger or a pen-like input tool corresponding entries can be made or various actions initiated. By using such a touchscreen 5 the number of operating elements, such as e.g. buttons, switches, slide controls, control dials or the like can be reduced substantially and this enables the intuitive operation of the device 1. Furthermore, the variety of different buttons can be reduced and thereby a better overview and more comfortable operation can be achieved. Electromechanical input elements 8 are formed in the device 1 in an advantageous manner for the most frequently used functions or for functions in which so-called tactile feedback is advantageous. Such functions are mostly movement functions or switch-on or off functions or functions for the incremental or decremental change of parameters. Said input elements 8 are thereby preferably formed by a membrane keypad 9 with a tactile acknowledgement of the switching operation or by input elements 8 with traceable and/or acoustic recognition of the switching point.

In addition to said input elements 8 with a clearly recognizable switching function the device 1 can preferably also comprise at least one operating element 10 to be moved by a user of the device 1 in the manner of a control lever, joystick 11, rotary potentiometers, space mouse, electronic hand wheel or the like. By means of such an operating element 10 mostly the directions and/or speeds of movements of a machine or robot to be controlled can be determined or performed comfortably and intuitively.

Furthermore, the device 1 can comprise at least one safety switch device 12, which is secured onto or into the housing 7 of the device 1 and is to be operated by a user mainly when performing safety-critical movement sequences or changes in operating states at the same time as the actual programming or operating elements 10 of the input device 3. Said safety switch device 12, which can also be denoted as an enabling switch 13, is used for avoiding an unintentional, unforeseen output of control commands for a machine, a robot or a technical process. The safety switch device 12 is provided for use in combination with the actual programming or operating elements 10, such as for example joysticks, buttons or switches, for activating a movement sequence or for changing an operating status of electromechanical machine or industrial robots. In particular, such safety switch devices 12 are activated in combination with the usual operating or control elements for performing safety-critical movement sequences or for the intended introduction of operating states, in which there is an increased risk of an accident for the machine or persons. The safety switch device 12 is thereby integrated into the electric control of the machine or the robot such that the programming or operating elements 10 or input elements 8 to be secured are only switched effectively when adopting an approved position on the safety switch device 12. The safety switch device 12 is therefore often denoted in practice as an enabling button 13.

As shown best in FIG. 3 an electronic control device 14 can be mounted in the housing 7 of the device 1, in which control device the possible operating functions of at least the device 1 are implemented. Said control device 14 comprises at least one software-controlled micro-computer for performing computer operations, for evaluating data and controlling function sequences of the device 1 and/or a machine to be controlled. Said at least one microcomputer is arranged on a printed circuit board together with further electronic components, such as e.g. memory modules for the interim storage of data and/or software programs, driver modules for interfaces, modules with the operating system and the like, which circuit board is mounted wholly in a housing 7 which is as unbreakable as possible.

Said control device 14 comprises at least one communication interface 15 to an external control device for a machine or a robot and/or to a host computer. Said at least one communication interface 15 is preferably in the form of a standardized interface, which is suitable for connecting to conventional data bus systems and is in the form for example of an Ethernet, CAN, serial or internet communication interface or other wire-connected interface. Alternatively or in combination with a wire-connected communication interface 15 it is of course also possible to have wireless communication interfaces 15, in particular in the form of radio interfaces and/or infrared interfaces on the device 1. The communication interface 15 can also comprise a so-called Bluetooth interface, via which a data connection to peripheral electronic components can be formed within a restricted communication range, e.g. a keyboard, mouse, printer or other computing unit.

The device 1 can also have an emergency off switch 16, the activating element 17 of which protrudes from the housing 7 or projects from the housing surface. On activating said emergency off switch 16 a machine to be controlled is set into emergency off or emergency stop mode, in which at least some of the movement sequences are stopped or at least some sections of the machine to be controlled are switched off from the power supply.

A lower side 18 of the housing 7 facing away from the field of vision of a user when the latter assumes the operating position of the device 1 can comprise at least one gripping area 19, by means of which the device 1 can be held securely and as comfortably as possible during its intended operation or use. Preferably, the safety switch device 12 is assigned to said gripping area 19 of the housing 7, which can be gripped securely or tightly by a hand of a user of the device 1. The two or three-step safety switch device 12 is thus positioned in the gripping area 19 of the housing 7 so that the safety switch device 12 on adopting the correct positions of use or operation of the device 1 can be activated easily by at least one finger, preferably by the fingers of the hand in which the housing 7 is held. The at least one gripping area 19 can be formed for example by a curved holding strip 20 on the lower side 18 of the housing 7. By means of the aforementioned measures the user only needs one hand to hold the housing 7 and activate the safety switch device 12, as mainly shown in FIG. 1. By means of the curved holding strip 20, which defines at least two gripping areas 19, the device 1 can be held as ergonomically as possible with both the right and the left hand and operated by the other hand on its upper side 6.

The components necessary for control technology purposes, as mentioned above by way of example and in extracts, are arranged at least partly in an inner receiving space 21 of the housing 7. In order to avoid faults and short-circuits, mainly the electrotechnical or electronic components of the control device 14 need to be protected as reliably as possible from impurities or from contact with electrically conductive elements or from fluids or moisture. It is preferable to make the housing 7 from plastic, in particular from a hard plastic and to use a plastic injection molding method to form plastic molded parts for the housing 7. The housing 7 is preferably made up of two parts or multiple parts, whereby it comprises a first and at least one further housing shell 22, 23 for forming the hollow or receiving space 21 for the electrotechnical components. The housing shells 22, 23 can thus be configured as half shells, which define the hollow or receiving space 21 after the assembly or joining together in a predefined joining direction—arrow 24, which is closed externally as far as possible by the at least two housing shells 22, 23 or defined in relation to the spatial limitation. Half shells are advantageous with regard to the accessibility or ability to assemble or test electrotechnical components on the inside of the housing 7. In addition to a preferably two-shell housing design it is also possible alternatively to combine or join together three or more housing parts in order to create the essentially externally closed receiving space 21 for electrotechnical components.

Therefore, between the respective housing shells 22, 23 a transitional or joining point 25 is provided which is designed such that the unwanted penetration of liquids or foreign bodies into the receiving space 21 for the electrotechnical components is prevented as far as possible. Said transitional or joining point 25 is preferably provided in the casing portion 26 of the housing 7. The casing portion 26 defines essentially the wall sections of the housing 7 and thus connects a cover surface or cover plate 27 and a base plate 28 forming the base section of the housing 7. The cover plate 27, the base plate 28 and/or the walls of the casing portion 26 can of course have flat, domed, recessed or differently shaped sections in order achieve the best possible ergonomics and also the best use of space.

As shown mainly in FIGS. 1 and 3, the transition or joining point 25 between the housing shells 22, 23 is preferably formed approximately in the middle of the casing portion 26 so that the two housing shells 22, 23 have approximately the same receiving capacity or almost the same web or wall heights. The transition or joining point 25 thus provides an almost bisecting interface in relation to the casing portion 26. In particular, between the housing shells 22, 23 there is a transitional portion 29 which is provided for joining and if necessary separating the housing shells 22, 23, which needs to be sealed in order to prevent the undesirable penetration of foreign bodies or liquids into the inside of the housing via the transition or joining point 25.

For sealing the transitional portion 29, as already known, at least one band or ring-like sealing element 30, 30' is formed. Said at least one sealing element 30, 30' is preferably made from an elastomer plastic, which has elastic flexible or spring-elastic restoring properties. The sealing element 30, 30' is thus formed in the vicinity of or on the transition or joining point 25 between correctly assembled housing shells 22, 23.

In the exemplary embodiment according to FIG. 3 a first embodiment of a carrier element 31 for the at least one sealing element 30, 30' is illustrated. Said carrier element 31 extends in the circumferential direction of the housing 7 or is provided approximately parallel to the transitional portion 29. In particular, it is arranged approximately along the transition or joining point 25 between the housing shells 22, 23.

The at least one sealing element 30, 30' is mounted at least partially between the two sides of said essentially X or H-shaped carrier element 31. In the correctly joined together state of the housing shells 22, 23, as shown in FIG. 3, the at least one sealing element 30 is forced in transverse direction to the joining direction—arrow 24—between the housing shells 22, 23 against at least one sealing face 32, 33 respectively on the first and further housing shell 22, 23. Said sealing faces 32, 33 thus nm parallel or essentially parallel to the joining direction—arrow 24—of the housing shells 22, 23. In this way an improved, in particular more reliable seal is obtained between the housing shells 22, 23.

It is an advantage in this case if the first housing shell 22 comprises a first housing web 35 which forms the first sealing face 32. In addition, the further housing shell 23 comprises a further housing web 36, which forms the further sealing face 33. As also shown in FIG. 3, in this case the first housing web 35 and the further housing web 36 are aligned above one another in the correctly assembled state of the housing shells 22, 23 and are essentially flush in their alignment. This means that the longitudinal middle planes of the housing webs 35, 36 are arranged in a common, for example vertically aligned plane 34—according to the dash-dotted line in FIG. 4. In particular, a lateral offset is avoided as far as possible between the housing webs 35, 36. The facing longitudinal edges 37, 38 of the housing webs 35, 36 are arranged at a distance 39 from one another, as shown best in FIG. 4. Said longitudinal edges 37, 38 can thus also form the sealing faces 32, 33, as illustrated in the embodiment according to FIG. 8, or represent a portion to the sealing faces 32, 33 on the wall faces of the housing webs 35, 36. The at least one sealing element 30, 30' is clamped or secured between the sealing faces 32, 33 and the carrier element 31, in order to thus obtain a sufficient sealing effect between the longitudinal edges 37, 38 or the sealing faces 32, 33 of the housing webs 35, 36 and the carrier element 31.

It is also advantageous if the first and the further housing web 35, 36 and the carrier element 31 are components of a double-walled casing portion 26 of the housing 7, as shown by way of example in FIGS. 3 and 4. In the embodiment according to FIG. 1-4 thus a double-walled casing portion 26 is provided, an inner wall 40 of said double-walled casing portion 26 forming the fluid-tight and solid body-tight barrier between the receiving space 21 for the electrotechnical components and the external surroundings of the housing 7. Said inner wall 40 is thus formed by the housing webs 35, 36 on the first and further housing shell 22, 23 by the carrier element 31 and the at least one sealing element 30, 30'. An outer wall 41 of the housing 7 defining and forming the casing portion 26 is formed by wall webs 42, 43 formed on the first and the further housing shell 22, 23, in particular formed integrally thereon. Said wall webs 42, 43 are thus formed at a distance from the housing webs 35, 36 arranged on the inside of the housing 7. The outer wall webs 42, 43 can thus form an elastically restoring crumple or deformation zone which cushions certain impact loads acting on the casing portion 26 of the housing 7 before said impact forces act directly on the inner housing webs 35, 36 or on the sealing elements 30, 30' secured between the carrier element 31 and the housing webs 35, 36. This is an advantage in particular if the mobile device 1 falls to the ground and the casing portion 26 hits the ground. The outer wall webs 42, 43 can—as indicated in FIG. 4—be locked together in a form-fitting manner. However, it is also possible to form a marginal gap between the end faces of the wall webs 42, 43, as shown in FIG. 5, 6. A fluid-tight connection between the opposite wall webs 42, 43 forming the outer wall 41 is not absolutely necessary, as the liquid or solid body barrier is provided by the inner wall 40 arranged at a distance 39a from the outer wall 41.

Preferably, a structurally independent, in particular separately designed carrier element 31 is provided for at least one sealing element 30, in particular for at least two sealing elements 30, 30'. In particular, each housing shell 22, 23 or the inner housing webs 35, 36 on each housing shell 22, 23 is assigned or allocated at least one sealing element 30, 30' and held in position by means of the carrier element 31 or forced in a sealing manner against the housing webs 35, 36.

Correctly joined together housing shells 22, 23 can be held together or connected by at least one snap connection in a relative position forming the intended housing 7. Preferably, alternatively or in addition to a snap connection at least one screw connection 44 is provided in order to fix the housing shells 22, 23 in the correct position relative to one another. By way of example in the lower housing shell 22 a plurality of holding pins 45 are formed which correspond or interact with corresponding holding pins 46 in the upper housing shell 23. Said holding pins 45, 46 are preferably screwed together by means of screw connection 44, whereby this type of connection is also referred to as a screw boss connection.

The individual holding pins 45, 46 are preferably distributed in the circumferential area of the receiving space 21 of the housing 7. The screw connections 44 or their screws are preferably accessible from the lower side 18 of the housing 7. Via said screw connections 44 or holding pins 45, 46 a sufficiently large and as far as possible uniformly distributed pretensioning force can be built up between corresponding support or stop surfaces on the first and further housing shell 22, 23. Said support or stop surfaces can be formed on the facing end edges of the holding pins 46, 46 and/or on the facing edge edges of the wall webs 42, 43. The sealing of the receiving space 21 from fluids or solid body particles is primarily ensured by means of the inner wall 40, in particular by the inner housing webs 35, 36, the carrier element 31 connecting or bridging the housing webs 35, 36 and sealing elements 30, 30' supported by the carrier element 31 or forced against the housing webs 35, 36. The structurally separate or independently designed carrier element 31 for the at least one sealing element 30, 30' thus also functions as a mechanical connecting or transitional portion, in particular as a bridging element 31a between the spaced apart longitudinal edges 37, 38 of the housing webs 35, 36.

FIG. 5, 6 show an advantageous embodiment of a sealed transitional portion 29 between two housing shells 22, 23 of a housing 7.

In this case also a double-walled casing portion 26 is provided for the housing 7. A portion of the outer wall 41 is formed in this case by a wall web 42 formed in one piece on the base plate 28. In continuation of this wall web 42 on the upper housing shell 23 a further wall web 43 is formed which is formed in one piece on the cover plate 27 of the housing 7. The outer wall 41 formed by the two wall webs 42, 43 is curved outwardly in this embodiment, in particular curved convexly. The multipart, fluid-tight inner wall 40 is arranged at a distance 39a from the outer wall 41. The inner wall 40 consists of the housing webs 35, 36 that are aligned flush and arranged vertically above one another, wherein the first housing web 35 is aligned essentially at right angles to the base plate 28 and the further housing web 36 is aligned essentially at right angles to the cover plate 27. By means of at least one holding pin 45, 46 and/or at least one screw connection 44 the two housing shells 22, 23 are connected together and secured against unwanted separation.

Also in this particularly advantageous embodiment the carrier element 31 is configured as a structurally independent body or as a separate component, as shown in FIG. 5, 6. A carrier element 31 of this kind has in its longitudinal direction at least one groove-like depression 47, 48. Said at least one depression 47, 48 is provided for receiving at least one sealing element 30, 30'. In particular, in the carrier element 31 two opposite depressions 47, 48 are formed in which a sealing element 30, 30' is arranged respectively. At least one of these depressions 47, 48—but preferably both depressions 47, 48—are also designed for fitting or pushing the carrier element 31 onto at least one free-standing end portion 51, 52 facing away from a base section 49, 50 of the housing webs 35, 36 by at least one of the housing webs 35, 36. In this way—as shown in FIGS. 5, 6—the at least one sealing element 30, 30' is also least partially surrounded on its outside 53, 54 by the carrier element 31. It is essential in this case that the at least one sealing element 30, 30' because of mounting in the at least one groove-like depression 47, 48 is pushed in transverse direction to the joining direction—arrow 24—between the housing shells 22, 23 against at least one sealing face 32, 32' or 33, 33' on the first and further housing shell 22, 23.

Figure 9:
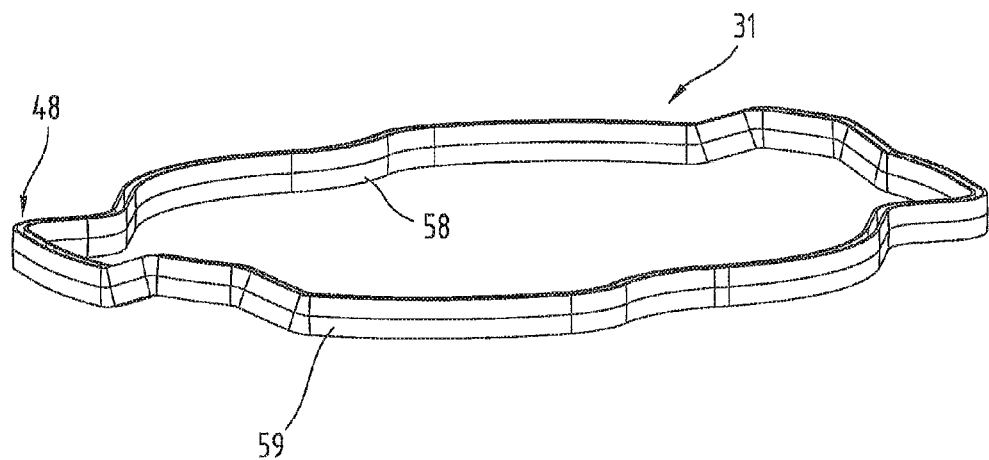
FIG. 9 shows an annular carrier element for at least one sealing element in perspective view.

The carrier element 31 for the at least one sealing element 30, 30' is configured—as shown best from an overview with FIG. 9, 10—to be band or ring-like. It is expedient if said carrier element 31 has an essentially H-shaped cross section, by means of which the opposite groove-like depressions 47, 48 are defined. Each of said depressions 47, 48 is provided for receiving at least one sealing element 30, 30' respectively. Furthermore, said depressions 47, 48 are provided for receiving or cupping the free, facing end portions 51, 52 of the housing webs 35, 36. This means that the carrier element 31 that is essentially H-shaped in cross section is a mechanical coupling or connecting element, in particular a bridging element 31a between the housing webs 35, 36, which mechanically couples the projecting end portions 51, 52 of the housing webs 35, 36 with the interconnection of the elastomer sealing elements 30, 30'.

It is thus an advantage if the carrier element 31 can be fitted without the aid of tools, i.e. simply by pushing on with fingers, onto the housing webs 35, 36. In the assembled state of the housing shells 22, 23 the carrier element 31 is then secured in frictionally and form-fitting manner with the interconnection of at least two sealing elements 30, 30' between the opposite housing webs 35, 36. It is an advantage in this case if the dimensions of the carrier element 31, in particular the dimensions of the groove-like depressions 47, 48 in the carrier element 31, are dimensioned such that the at least one sealing element 30, 30' is pushed by prestressing force exerted by the carrier element 31 against at least one sealing face 32, 32' and 33, 33' on the first and further housing shell 22, 23, in particular on at least one sealing face 32, 33 of the housing webs 35, 36.

According to one advantageous embodiment the at least one sealing element 30, 30' is configured as a cup seal 55, 55' that is essentially U-shaped in cross section. Said cup seal 55, 55' that is essentially U-shaped in cross section bears on opposite sealing faces 32, 32' or 33, 33' of at least one housing shell 22, 23. In particular, said cup seal 55, 55' bears on the opposite wall surfaces of each housing web 35, 36. In this way the sealing element 30, 30' is pushed by means of the carrier element 31 in transverse direction to the joining direction—arrow 24—of the housing shells 22, 23 against the sealing faces 32, 32' or 33, 33'. In particular, by means of the at least one carrier element 31 a permanent pretensioning is exerted onto the at least one sealing element 32, 33, whereby the acting direction of said prestressing force is directed transversely to the joining direction—arrow 24. Accordingly the sealing effect is achieved mainly in that by means of the carrier element 31 prestressing forces are exerted onto the at least one sealing element 30, 30', which act within a parting or joining plane between the housing shells 22, 23 and are aligned radially to a virtual middle point or center of the housing 7. The pretensioning forces of the H-shaped carrier element 31 act from the receiving space 21 radially outwards onto the sealing faces 32, 33 and also radially inwards onto the opposite sealing faces 32', 33' on the housing webs 35, 36. The vectorial sum of the force components acting transversely to the joining direction on the sealing faces 32, 33 and 32', 33' is essentially nullified, or the sealing forces are applied via the sides and the web of the carrier element 31 and thus the resulting transverse forces on the housing webs 35, 36 are at least mostly nullified.

Figure 10:
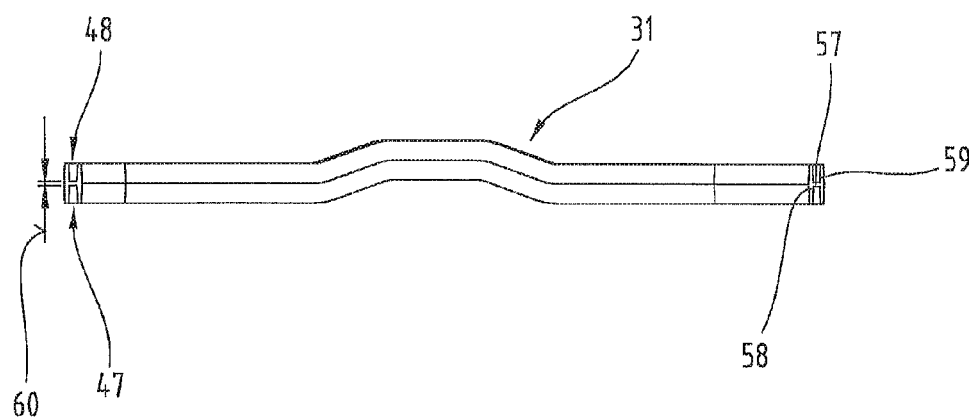
FIG. 10 shows a precontoured, band-like carrier element in side view.

The carrier element 31, as illustrated by way of example in FIGS. 9, 10, is preferably configured as a structurally independent, injection molded or extruded plastic element. The carrier element 31 is preferably made from hard plastic which has a greater dimensional stability or form stability than the elastically flexible sealing element 30, 30'. The elongated carrier element 31, which is configured in particular to be profile-like and can be closed in an annular form, is designed to be flexible in form and changeable in form in its longitudinal direction, in relation to its cross sectional form but is comparatively dimensionally stable, so that it exerts sufficient pressing force or permanent prestressing on the at least one sealing element 30, 30', so that the carrier element 31 is pushed or fitted onto the at least one housing web 35, 36.

FIG. 7 shows a further, possibly independent embodiment of the casing portion 26 or the transitional portion 29 to be sealed between the housing shells 22, 23, wherein the same reference numbers and component names are used for the same parts as in the preceding figures. To avoid unnecessary repetition reference is made to the detailed description in the preceding figures.

In this embodiment the sealing elements 30, 30' mounted by the carrier element 31 are configured to be essentially omega-like in cross section. In particular, in this way the two cup seals 55, 55' each have two support shoulders 56, 56', which are provided for supporting or bearing on the carrier element 31. Preferably, the cup seals 55, 55', which are essentially U-shaped in cross section, each have a laterally projecting support shoulder 56 or 56' on the free end portions of the two sides. The latter are used for supporting and correctly positioning or mounting the cup seal 55, 55' inside the groove-like depressions 47, 48. In particular, said support shoulders 56, 56' ensure the correct alignment and if necessary the pressing of the cup seals 55, 55' relative to the housing webs 35, 36 covered or partly cupped by the cup seals 55, 55'. Overall thus an approximately omega-shaped sealing element 30, 30' is formed, which in connection with a carrier element 31 with an essentially H-shaped cross section achieves an optimal sealing effect, when the corresponding sealing element 30, 30' is inserted into the opposite depressions 47, 48 of the H-shaped carrier element 31, as shown in FIG. 7.

As also shown in an embodiment according to FIG. 7 a connecting web 57 can be provided between the opposite sides 58, 59 of the carrier element 31 that is essentially H-shaped in cross section also for pressing the at least one sealing element 30, 30' or the corresponding cup seal 55, 55' against the opposite longitudinal edges 37, 38 of the housing webs 35, 36. In this way the sealing effect of the sealing elements 30, 30', which are essentially U-shaped or omega-shaped in cross section, is increased further.

According to one advantageous development a thickness 60 of the connecting web 57 is measured to be greater than the thickness dimensions of the sides 58, 59. To minimize the increase in weight of the carrier element 31 the increased thickness 60 of the transversely running connecting web 57 for the sides 58, 59 can be achieved by a plurality of ribs 61, 61'. In particular, in the respective depressions 47, 48 a plurality of spaced apart ribs 61 or 61' are formed spaced apart and consecutively in longitudinal direction of the carrier element, which results in the increased thickness 60 of the connecting web 57. In this way an excessive increase in the weight of the carrier element 31 is avoided and the middle or central section of the carrier element 31 still has an increased thickness 60.

By having this greater thickness 60 of the connecting web 57 between the spaced apart longitudinal edges 37, 38 of the housing webs 35, 36 the height 62, 63 of the housing webs 35, 36 can be selected to be comparatively smaller. This mainly has advantages in terms of injection molding. In particular, in this way the housing webs 35, 36 can be injected to be relatively thin without causing problems associated with the filling level of the mold. A further essential advantage of these reduced or reducible heights 62, 63 of the housing webs 35, 36 is that hardening or shrinking-related sink marks are prevented in the plastic material in the region of the base 49, 50 of the housing webs 35, 36. In particular, in this way shrinking-related material indentations or sink marks are prevented as far as possible in the transitional area between the base plate 28 and the housing web 35 or between the cover plate 27 and the housing web 36. Consequently, because of the comparatively smaller heights 62, 63 of the housing webs 35, 36 a visually perfect surface of the housing shells 22, 23 is also ensured in the connecting or transitional area to the inner housing webs 35, 36. In the embodiment according to FIG. 7 thus the comparatively high or thick connecting web 57 of the carrier or bridging element 31, 31a bridges at least partly the relatively large distance between the spaced apart longitudinal edges 37, 38 of the housing webs 35, 36. The ribs 61, 61' running between the sides 58, 59 can thus be configured to be essentially triangular, rectangular or wave-like in cross section.

FIG. 8 illustrates a further embodiment of the carrier element 31 connected to two sealing elements 30, 30'. The sealing element 30, 30' formed in each of the depressions 47, 48 is designed to be block or bead-like in cross section. According to a preferred embodiment said sealing elements 30, 30' are foamed into the depressions 47, 48 of the carrier element 31 that is H-shaped in cross section. The sealing elements 30, 30' are thus made from a foamed plastic, which is applied onto the carrier element 31 or inserted into its depressions 47, 48 and in this way an adhesive and/or force-fitting connection is formed with the carrier element 31. In the embodiment according to FIG. 8 each of the sealing elements 30, 30' is pushed with the interconnection of the carrier element 31 against the spaced apart longitudinal edges 37, 38 of the housing webs 35, 36. The longitudinal edges 37, 38 thus represent sealing faces 32, 33 on the housing webs 35, 36.

According to an alternative embodiment, as indicated in FIG. 8 by dashed lines, it is also possible to configure the carrier element 31 for the at least one sealing element 30, 30' to be essentially plate or strip-like. On the opposite flat sides of said essentially plate-like carrier element 31—indicated by dashed lines—a sealing element 30, 30' is formed respectively. Mainly when the sealing elements 30, 30' are formed by foam seals, which are foamed onto the opposite flat sides of the carrier element, can said sealing elements be designed to be bead-like in cross section, as also indicated by dashed lines. In this way the sealing elements 30, 30' and the carrier element 31 arranged in between represent a one-piece, adhesively joined component which is secured between the spaced apart longitudinal edges 37, 38 of the housing webs 35, 36.

In this configuration the sealing pressure is built up in height or axial direction relative to the housing webs 35, 36 whereas the sealing pressure is built up in the configurations according to FIGS. 1 to 7 in an almost perpendicular direction relative to the wall surfaces of the housing webs 35, 36. In the embodiment according to FIG. 8 the sealing pressure is no longer built up radially to a virtual center point of the housing 7, but is applied in axial direction relative to the housing webs 35, 36. The housing 7 therefore mainly needs to sufficiently rigid in the configuration according to FIG. 8, so that the sealing pressure is distributed evenly on the sealing elements 30, 30'. The distance between spaced apart screw points, in particular the distance between the screw connections 44—FIG. 5—should thus not exceed a maximum distance to ensure a sufficient sealing effect. The spacing division between the individual screw connections 44 or between their holding pins 45, 46—FIG. 5—is thus heavily dependent on the housing design and on the plastic used or on the plastic foam used.

By way of the described measures the housing webs 35, 36 can have positive and negative contours, whereby the housing webs 35, 36 form convex outwardly and concave inwardly curved outer surfaces in relation to a central section of the housing 7 without causing potential sealing problems in this way.

The exemplary embodiments show possible embodiment variants of the housing 7 or the carrier element 31, whereby it should be noted at this point that the invention is not restricted to the embodiment variants shown in particular.

Finally, as a point of formality, it should be noted that for a better understanding of the structure of the housing 7, the latter and its components have not been represented true to scale in part and/or have been enlarged and/or reduced in size.

The problem addressed by the independent solutions according to the invention can be taken from the description.

| List of reference numerals | |
|---|---|
| 1 | device |
| 2 | output device |
| 3 | input device |
| 4 | screen |
| 5 | touchscreen |
| 6 | upper side |
| 7 | housing |
| 8 | input elements |
| 9 | membrane keypad |
| 10 | operating element |
| 11 | joystick |
| 12 | safety switch device |
| 13 | enabling button |
| 14 | control device |
| 15 | communication interface |
| 16 | emergency off switch |
| 17 | activating element |
| 18 | lower side |
| 19 | gripping area |
| 20 | holding strip |
| 21 | receiving space |
| 22 | housing shell |
| 23 | housing shell |
| 24 | arrow (joining direction) |
| 25 | transition or joining point |
| 26 | casing portion |
| 27 | cover plate |
| 28 | base plate |

-continued

| List of reference numerals | |
|---|---|
| 29 | transitional portion |
| 30 | sealing element |
| 31 | carrier element |
| 31a | bridging element |
| 32 | sealing face |
| 33 | sealing face |
| 34 | plane |
| 35 | housing web |
| 36 | housing web |
| 37 | longitudinal edge |
| 38 | longitudinal edge |
| 39 | distance |
| 39a | distance |
| 40 | inner wall |
| 41 | outer wall |
| 42 | wall web |
| 43 | wall web |
| 44 | screw connection |
| 45 | holding pin |
| 46 | holding pin |
| 47 | depression |
| 48 | depression |
| 49 | base section |
| 50 | base section |
| 51 | end portion |
| 52 | end portion |
| 53 | outside |
| 54 | outside |
| 55 | cup seal |
| 56 | support shoulder |
| 57 | connecting web |
| 58 | side |
| 59 | side |
| 60 | thickness |
| 61 | ribs |
| 62 | height |
| 63 | height |

The invention claimed is:

1. A housing for receiving electrotechnical components, which housing comprises:
    a first housing shell and a second housing shell for forming a receiving space for electrotechnical components, and
    a carrier element,
    wherein the first housing shell comprises a first housing web forming a first sealing face and forming a second sealing face disposed opposite from the first sealing face and wherein the first housing shell also comprises a first outer wall web,
    wherein the second housing shell comprises a second housing web forming a third sealing face and forming a fourth sealing face disposed opposite from the third sealing face and wherein the second housing shell also comprises a second outer wall web,
    wherein the first housing web and the second housing web are part of an inner wall of a double-walled casing portion of the housing,
    wherein the first outer wall web and the second outer wall web are part of an outer wall of the double-walled casing portion of the housing,
    wherein the inner wall is formed at a distance spaced from the outer wall of the double-walled casing portion,
    wherein a first elastic sealing element is band-like or ring-like and is designed for sealing a transitional portion between the first housing shell and the second housing shell and is made from an elastomer material,
    wherein a second elastic sealing element is band-like or ring-like, is designed for sealing the transitional portion, and is made from an elastomer material,
    wherein the first housing web has a first housing web longitudinal edge,
    wherein the second housing web has a second housing web longitudinal edge,
    wherein in an assembled state of the first housing shell and the second housing shell the first housing web longitudinal edge faces the second housing web longitudinal edge,
    wherein, in the assembled state of the first housing shell and the second housing shell, the first housing web and the second housing web are aligned above one another and flush and the first housing web longitudinal edge and the second housing web longitudinal edge are arranged at a distance from one another,
    wherein the carrier element comprises a comparatively dimensionally stable hard plastic,
    wherein the carrier element forms a bridging element between the first housing web and the second housing web,
    wherein the carrier element pushes the first elastic sealing element and the second elastic sealing element:
        (i) in a transverse direction relative to a joining direction of the first and second housing shells, or
        (ii) in a joining direction of the first and second housing shells against the first sealing face on the first housing web and against the third sealing face on the second housing web;
    wherein the first elastic sealing element is designed as a first cup seal, the first cup seal being substantially U-shaped in cross section,
    wherein the first cup seal bears against the first sealing face and against the second sealing face of the first housing web,
    wherein the second elastic sealing element is designed as a second cup seal, the second cup seal being substantially U-shaped in cross section,
    wherein the second cup seal bears against the third sealing face and against the fourth sealing face of the second housing web,
    wherein the carrier element is substantially H-shaped in cross section such that the carrier element has a carrier element first side and a carrier element second side disposed opposite from the carrier element first side, the carrier element first side and the carrier element second side forming a first groove-like depression and a second groove-like depression,
    wherein the carrier element is a separate component and the first elastic sealing element is arranged in the first groove-like depression and held in position by the first groove-like depression and the second elastic sealing element is arranged in the second groove-like depression and held in position by the second groove-like depression,
    wherein the carrier element first side is designed for pressing the first elastic sealing element against the first sealing face of the first housing web and is designed for pressing the second elastic sealing element against the third sealing face of the second housing web,
    wherein the carrier element second side is designed for pressing the first elastic sealing element against the second sealing face of the first housing web and is designed for pressing the second elastic sealing element against the fourth sealing face of the second housing web, and wherein the carrier element is spaced from and does not contact the outer wall.

2. The housing as claimed in claim 1, wherein the inner wall of the double-walled casing portion is formed by the first and second housing webs, by the carrier element, by the first elastic sealing element, and by the second elastic sealing element.

3. The housing as claimed in claim 1, wherein the first groove-like depression and the second groove-like depression extend along a longitudinal direction of the carrier element,
   wherein the first housing web comprises a first housing web base section and a first housing web free-standing end section facing away from the first housing web base section,
   wherein the second housing web comprises a second housing web base section and a second housing web free-standing end section facing away from the second housing web base section,
   wherein the first groove-like depression is also designed for fitting or pushing the carrier element onto the first housing web free-standing end section so that the first elastic sealing element is at least partly surrounded on its outside by the carrier element, and
   wherein the second groove-like depression is also designed for fitting or pushing the carrier element onto the second housing web free-standing end section so that the second elastic sealing element is at least partly surrounded on its outside by the carrier element.

4. The housing as claimed in claim 1, wherein the carrier element is designed to be band or ring-like,
   wherein the second groove-like depression is disposed opposite from the first groove-like depression,
   wherein the first housing web has a first housing web free-standing end section,
   wherein the second housing web has a second housing web free-standing end section,
   wherein the second housing web free-standing end section faces the first housing web free-standing end section,
   wherein the first groove-like depression is designed for receiving or cupping the first housing web free-standing end section of the first housing web, and
   wherein the second groove-like depression is designed for receiving or cupping the second housing web free-standing end section of the second housing web.

5. The housing as claimed in claim 1, wherein the first housing web is disposed opposite from the second housing web, and
   wherein the carrier element can be fitted onto the first and second housing webs without tools and can be secured by the first and second housing webs in a frictional and form-fitting manner.

6. The housing as claimed in claim 1, wherein the second groove-like depression is disposed opposite from the first groove-like depression, and
   wherein dimensions of the first groove-like depression and of the second groove-like depression in the carrier element are such that the first elastic sealing element is pushed by pretensioning force exerted by the carrier element against the first sealing face on the first housing web of the first housing shell and the second elastic element is pushed by pretensioning force exerted by the carrier element against the third sealing face on the second housing web of the second housing shell.

7. The housing as claimed in claim 1, wherein the carrier element is configured as a structurally independent injection-molded or extruded plastic element.

8. The housing as claimed in claim 1, wherein the carrier element is configured to be flexible in a longitudinal direction and is configured to be comparatively dimensionally stable in terms of its cross-sectional shape.

9. The housing as claimed in claim 1, wherein the carrier element has a spatially predefined contour adapted to a course of the first and second housing webs, the course comprising the first and second sealing faces on the first housing web on the first housing shell and the third and fourth sealing faces on the second housing web on the second housing shell.

10. The housing as claimed in claim 1, wherein the first housing web and the second housing web each have a positive and negative contour so that the first and second housing webs in relation to a central section of the housing form respective convex outwardly curved and concave inwardly curved external faces.

11. The housing as claimed in claim 1, wherein the carrier element has a connecting web formed between the carrier element first side and the carrier element second side for pressing the first elastic sealing element against the first housing web longitudinal edge of the first housing web and for pressing the second elastic sealing element against the second housing web longitudinal edge of the second housing web.

12. A housing for receiving electrotechnical components, which housing comprises:
    a first housing shell and a second housing shell for forming a receiving space for electrotechnical components,
    a carrier element,
    a first elastic sealing element and
    a second elastic sealing element,
    wherein the first housing shell comprises:
        a first outer wall web, and
        a first housing web with a first housing web longitudinal edge, wherein the first housing web is formed at a distance spaced from the first outer wall web,
    wherein the second housing shell comprises:
        a second outer wall web, and
        a second housing web with a second housing web longitudinal edge, wherein the second housing web is formed at a distance spaced from the second outer wall web,
    wherein the first housing web, the second housing web and the carrier element are part of an inner wall of a double-walled casing portion of the housing,
    wherein the first outer wall web and the second outer wall web are part of an outer wall of the double-walled casing portion of the housing,
    wherein the inner wall is formed at a distance spaced from the outer wall of the double-walled casing portion defining a buffer zone between the inner wall and the outer wall, wherein the carrier element is spaced from and does not contact the outer wall,
    wherein in an assembled state of the first housing shell and the second housing shell the first housing web longitudinal edge faces the second housing web longitudinal edge,
    wherein, in the assembled state of the first housing shell and the second housing shell, the first housing web and the second housing web are aligned above one another and flush and the first housing web longitudinal edge and the second housing web longitudinal edge are arranged at a distance from one another,
    wherein the carrier element forms a bridging element between the first housing web and the second housing web,
    wherein the carrier element is substantially H-shaped in cross section such that the carrier element has a first groove-like depression and a second groove-like depression disposed opposite from the first groove-like depression, wherein the carrier element is a separate component and the first elastic sealing element is arranged in the first groove-like depression and held in position by the first groove-like depression and the second elastic sealing element is arranged in the second groove-like depression and held in position by the second groove-like depression, wherein the first elastic sealing element is band-like or ring-like and is designed for sealing a transitional portion between the first housing shell and the second housing shell and is made from an elastomer material, wherein the second elastic sealing element is band-like or ring-like, is designed for sealing the transitional portion, and is made from an elastomer material and, wherein the carrier element pushes the first elastic sealing element and the second elastic sealing element:
  (i) in a transverse direction relative to a joining direction of the first and second housing shells, or
  (ii) in a joining direction of the first and second housing shells, against a first sealing face on the first housing web and against a second sealing face on the second housing web.

13. A housing for receiving electrotechnical components, which housing comprises:
  a first housing shell and a second housing shell for forming a receiving space for electrotechnical components,
  a carrier element,
  a first elastic sealing element and
  a second elastic sealing element,
  wherein the first housing shell comprises:
    a first outer wall web, and
    a first housing web with a first housing web longitudinal edge, wherein the first housing web is formed at a distance spaced from the first outer wall web,
  wherein the second housing shell comprises:
    a second outer wall web, and
    a second housing web with a second housing web longitudinal edge, wherein the second housing web is formed at a distance spaced from the second outer wall web,
  wherein the first housing web, the second housing web and the carrier element are part of an inner wall of a double-walled casing portion of the housing,
  wherein the first outer wall web and the second outer wall web are part of an outer wall of the double-walled casing portion of the housing and are locked together in a form-fitting manner,
  wherein the inner wall is formed at a distance spaced from the outer wall of the double-walled casing portion, wherein the carrier element is spaced from and does not contact the outer wall
  wherein in an assembled state of the first housing shell and the second housing shell the first housing web longitudinal edge faces the second housing web longitudinal edge,
  wherein, in the assembled state of the first housing shell and the second housing shell, the first housing web and the second housing web are aligned above one another and flush and the first housing web longitudinal edge and the second housing web longitudinal edge are arranged at a distance from one another,
  wherein the carrier element forms a bridging element between the first housing web and the second housing web,
  wherein the carrier element is substantially H-shaped in cross section such that the carrier element has a first groove-like depression and a second groove-like depression disposed opposite from the first groove-like depression,
  wherein the carrier element is a separate component and the first elastic sealing element is arranged in the first groove-like depression and held in position by the first groove-like depression and the second elastic sealing element is arranged in the second groove-like depression and held in position by the second groove-like depression,
  wherein the first elastic sealing element is band-like or ring-like and is designed for sealing a transitional portion between the first housing shell and the second housing shell and is made from an elastomer material,
  wherein the second elastic sealing element is band-like or ring-like, is designed for sealing the transitional portion, and is made from an elastomer material and,
  wherein the carrier element pushes the first elastic sealing element and the second elastic sealing element:
    (i) in a transverse direction relative to a joining direction of the first and second housing shells, or
    (ii) in a joining direction of the first and second housing shells, against a first sealing face on the first housing web and against a second sealing face on the second housing web.

* * * * *